United States Patent
Kim et al.

(10) Patent No.: US 11,012,086 B2
(45) Date of Patent: May 18, 2021

(54) ANALOG-TO-DIGITAL CONVERTER FOR CONVERTING ANALOG SIGNALS INPUT FROM A PLURALITY OF SENSORS

(71) Applicant: Seoul National University R&DB Foundation, Seoul (KR)

(72) Inventors: Minsung Kim, Gwacheon-si (KR); Jaehoon Jun, Seoul (KR); Suhwan Kim, Seoul (KR)

(73) Assignee: Seoul National University R&DB Foundation, Seoul (KR)

(*) Notice: Subject to any disclaimer, the term of this patent is extended or adjusted under 35 U.S.C. 154(b) by 0 days.

(21) Appl. No.: 16/692,865

(22) Filed: Nov. 22, 2019

(65) Prior Publication Data

US 2020/0153452 A1 May 14, 2020

Related U.S. Application Data

(63) Continuation of application No. PCT/KR2018/004552, filed on Apr. 19, 2018.

(30) Foreign Application Priority Data

May 23, 2017 (KR) .................. 10-2017-0063757

(51) Int. Cl.
*H03M 3/00* (2006.01)
*H03M 1/08* (2006.01)

(52) U.S. Cl.
CPC ........... *H03M 3/43* (2013.01); *H03M 1/089* (2013.01); *H03M 3/464* (2013.01)

(58) Field of Classification Search
CPC ......... H03M 3/43; H03M 1/089; H03M 3/464
(Continued)

(56) References Cited

U.S. PATENT DOCUMENTS

| | | | | |
|---|---|---|---|---|
| 5,157,435 A | * | 10/1992 | Min | ................. G02B 7/32 250/201.4 |
| 7,358,880 B1 | * | 4/2008 | Melanson | .............. G01D 5/145 341/143 |

(Continued)

FOREIGN PATENT DOCUMENTS

| | | |
|---|---|---|
| KR | 1020010003899 A | 1/2001 |
| KR | 1020020009425 A | 2/2002 |

(Continued)

OTHER PUBLICATIONS

"Pin-Programmable, Ultralow Noise, 24-Bit, Sigma-Delta ADC for Bridge Sensors", Analog Devices, AD7191, pp. 1-20, One Technology Way, Norwood, MA, USA.

(Continued)

*Primary Examiner* — Peguy Jean Pierre
(74) *Attorney, Agent, or Firm* — William Park & Associates Ltd.

(57) ABSTRACT

An analog-to-digital converter (ADC) includes an input circuit configured to receive a first analog signal output from a first sensor or a second analog signal output from a second sensor according to an operation mode and a bit stream; a filter configured to filter an output signal from the input circuit; a quantization circuit configured to generate the bit stream from an output signal of the filter; and a digital circuit configured to generate a first digital signal corresponding to the first analog signal or a second digital signal corresponding to the second analog signal by filtering the bit stream, wherein the operation mode includes a first mode selecting the first sensor and a second mode selecting the second sensor, and wherein the digital circuit refers to the second digital signal generated during the second mode to generate the first digital signal during the first mode.

13 Claims, 11 Drawing Sheets

(58) Field of Classification Search
USPC ................... 341/155, 143, 144, 120, 119
See application file for complete search history.

(56) References Cited

U.S. PATENT DOCUMENTS

| | | | |
|---|---|---|---|
| 8,915,646 B2 | 12/2014 | Wei et al. | |
| 10,546,270 B2* | 1/2020 | Barrenscheen | G06Q 10/087 |
| 2002/0126032 A1* | 9/2002 | Nanda | H03M 3/392 |
| | | | 341/155 |
| 2011/0133723 A1* | 6/2011 | Forsyth | G01D 5/145 |
| | | | 324/207.2 |
| 2016/0192084 A1 | 6/2016 | Oliaei | |
| 2016/0380646 A1* | 12/2016 | Kauffman | H03M 3/464 |
| | | | 341/118 |
| 2017/0026166 A1 | 1/2017 | Barrenscheen | |

FOREIGN PATENT DOCUMENTS

| | | |
|---|---|---|
| KR | 1020090121952 A | 11/2009 |
| KR | 1020100005329 A | 1/2010 |
| KR | 1020100092771 A | 8/2010 |
| KR | 101560051 B1 | 10/2015 |
| KR | 1020180052613 A | 5/2018 |

OTHER PUBLICATIONS

ADS126x 32-Bit, Precision, 38-kSPS, Analog-to-Digital Converter (ADC) with Programmable Gain Amplifier (PGA) and Voltage Reference, Feb. 2015, Texas Instruments Incorporated.
Matthias Steiner et al., "A 22.3b 1kHz 12.7mW Switched-Capacitor ΔΣ Modulator with Stacked Split-Steering Amplifiers", Oversampling Data Converters, Feb. 2, 2016, pp. 284-285, Session 15 / 15.8, IEEE International Solid-State Circuits Conference (ISSCC).

* cited by examiner

ANALOG-TO-DIGITAL CONVERTER FOR CONVERTING ANALOG SIGNALS INPUT FROM A PLURALITY OF SENSORS

CROSS-REFERENCE TO RELATED APPLICATIONS

This application is a continuation of and claims priority to PCT application No. PCT/KR2018/004552, filed on Apr. 19, 2018, which claims priority to Korean Patent Application No. 10-2017-0063757, filed on May 23, 2017, which is incorporated herein by reference in its entirety.

BACKGROUND

1. Technical Field

Various embodiments generally relate to an analog-to-digital converter (ADC) and more particularly to an ADC for converting analog signals input from a plurality of sensors into corresponding digital signals.

2. Related Art

In order to convert an analog signal output from a sensor into a digital signal, an ADC is widely used.

The operating characteristics of a sensor can vary non-linearly with temperature, so it is necessary to perform temperature compensation on the sensor for precise measurement.

However, in a case of adding a temperature sensor and a compensation circuit for each sensor for temperature compensation, the total area of the circuit increases and power consumption increases.

Temperature sensors and other signal sensors may share the same ADC.

However, it is difficult to optimize an ADC for both temperature signals and other types of analog signals at the same time, which may cause signal degradation for some signal sensors.

SUMMARY

In accordance with the present teachings, an analog-to-digital converter (ADC) may include an input circuit configured to receive a first analog signal output from a first sensor or a second analog signal output from a second sensor according to an operation mode and a bit stream; a filter configured to filter an output signal from the input circuit; a quantization circuit configured to generate the bit stream from an output signal of the filter; and a digital circuit configured to generate a first digital signal corresponding to the first analog signal or a second digital signal corresponding to the second analog signal by filtering the bit stream, wherein the operation mode includes a first mode selecting the first sensor and a second mode selecting the second sensor, and wherein the digital circuit refers to the second digital signal generated during the second mode to generate the first digital signal during the first mode.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
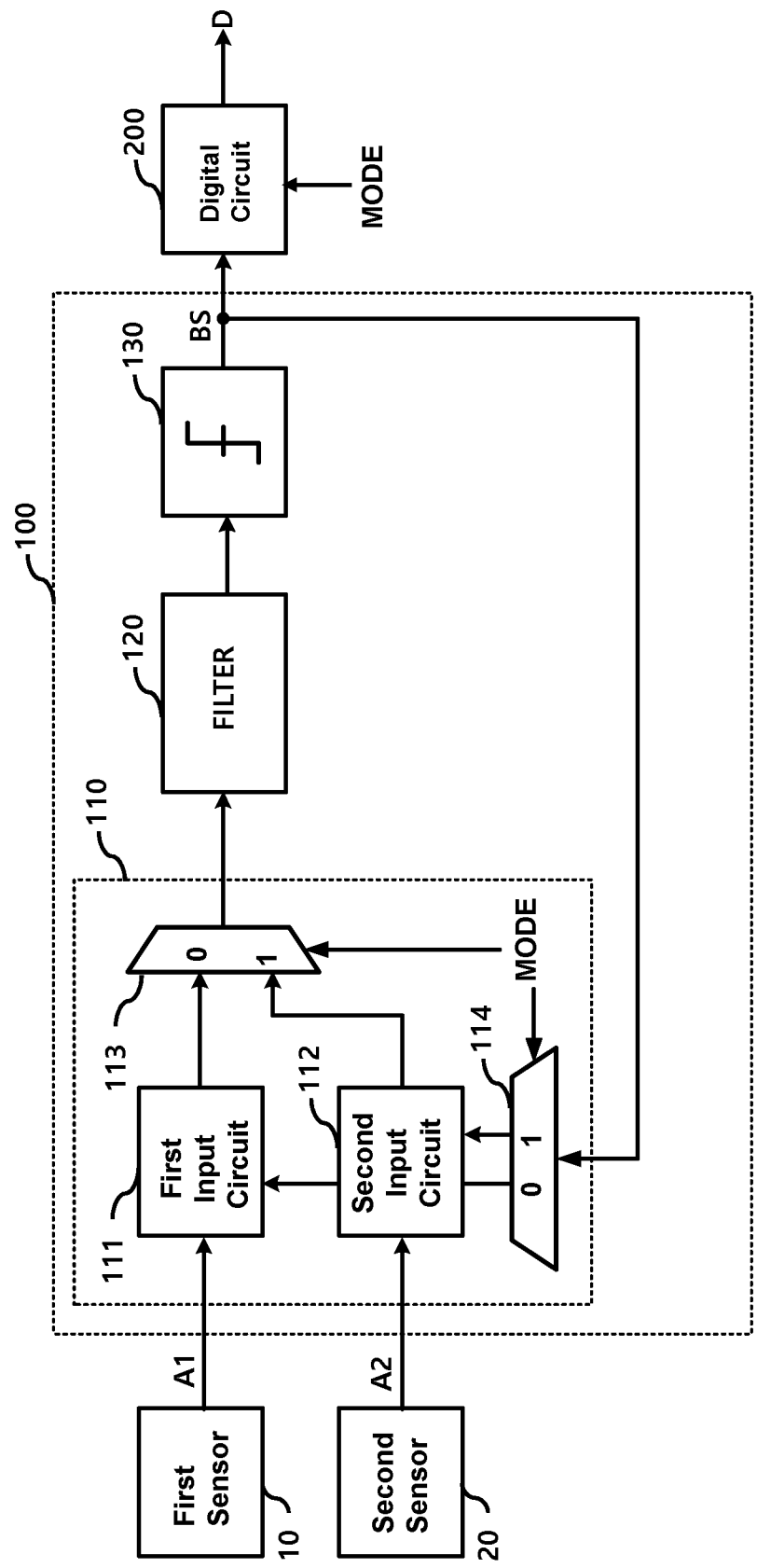
FIGS. 1 and 2 show block diagrams each illustrating an ADC according to an embodiment of the present disclosure.

FIG. 1 is a block diagram illustrating an ADC according to an embodiment of the present disclosure.

The ADC according to an embodiment of the present disclosure includes a sigma delta modulator 100 which receives a signal from a first sensor 10 and a second sensor 20 and outputs a bit stream BS and a digital circuit 200 for outputting the digital signal D by performing noise removing filtering on the bit stream BS.

The first sensor 10 and the second sensor 20 may perform different types of sensing operations, and output a first analog signal A1 and a second analog signal A2, respectively.

For example, the second sensor 20 may be a temperature sensor and the first sensor 10 may be a sensor that senses a signal other than a temperature signal.

Hereinafter, an embodiment of the present disclosure will be described assuming that the second sensor 20 is a temperature sensor.

Hereinafter, the second sensor 20 may be referred to as a temperature sensor and the first sensor 10 may be referred to as a signal sensor.

The ADC according to an embodiment of the present disclosure converts the first analog signal A1 output from the first sensor 10 into a first digital signal in the first mode and converts the second analog signal A2 output from the second sensor 20 into a second digital signal in the second mode.

In general, the operating characteristics of the semiconductor device may vary with temperature.

Accordingly, the ADC according to the present disclosure may perform an analog-to-digital conversion operation in the first mode by referring to a temperature measured in the second mode.

For example, the ADC may alternately perform the first mode and the second mode.

However, since the temperature does not change rapidly, a period in which the second mode is performed may be longer than a period in which the first mode is performed.

The temperature value, which may correspond to the second digital signal, measured in the second mode may be stored in a register. The register may be comprised in the digital circuit 200.

When operating in the first mode, the digital circuit 200 may adjust the operating characteristics of the digital circuit 200 by adjusting a filtering coefficient of a filter that may be included therein in consideration of the temperature value measured in the second mode.

In this case, a person of ordinary skill may easily adjust operating characteristics of the digital circuit 200 by controlling the filtering coefficient considering a temperature value, and therefore a detailed description thereof will be omitted.

The sigma delta modulator 100 includes an input circuit 110, a filter 120, and a quantization circuit 130.

The input circuit 110 may include a first input circuit 111 that receives the first analog signal A1 and a second input circuit 112 that receives the second analog signal A2.

The first selector 113 outputs an output of the first input circuit 111 to the filter 120 in the first mode or outputs an output of the second input circuit 112 to the filter 120 in the second mode according to the mode signal MODE.

The second selector 114 provides the bit stream BS output from the quantization circuit 130 to the first input circuit 111 in the first mode or to the second input circuit 112 in the second mode according to the mode signal MODE.

The first input circuit 111 outputs a signal according to the first analog signal A1 and the bit stream BS, and the second input circuit 112 outputs a signal according to the second analog signal A2 and the bit stream BS.

In order to reduce power consumption, the first input circuit 111 may be deactivated in the second mode and the second input circuit 112 may be deactivated in the first mode.

The filter 120 outputs a signal by filtering a signal output from the first selector 113.

The filter 120 performs a noise shaping function so that noise component moves out of the signal band. Since the noise shaping function performed in a sigma delta modulator is well known, a detailed description thereof will be omitted.

The quantization circuit 130 compares a signal output from the filter 130 with a reference signal and outputs a comparison result as the bit stream BS which is a digital signal.

When the output of the filter 120 is a differential signal, the quantization unit 130 may compare the two differential signals and output a comparison result as a digital bit stream BS.

The quantization circuit 130 may be implemented using a comparator or another analog-to-digital converter.

The bit stream BS output from the quantization circuit 130 is fed back to the input circuit 110.

The digital circuit 200 outputs the digital signal D by filtering the bit stream BS to remove noise located outside the signal band.

At this time, the digital signal D corresponds to the first digital signal for the first analog signal A1 in the first mode and to the second digital signal for the second analog signal A2 in the second mode.

As described above, the digital circuit 200 may adjust filtering coefficients and the like therein in the first mode according to the temperature value determined in the second mode.

Figure 2:
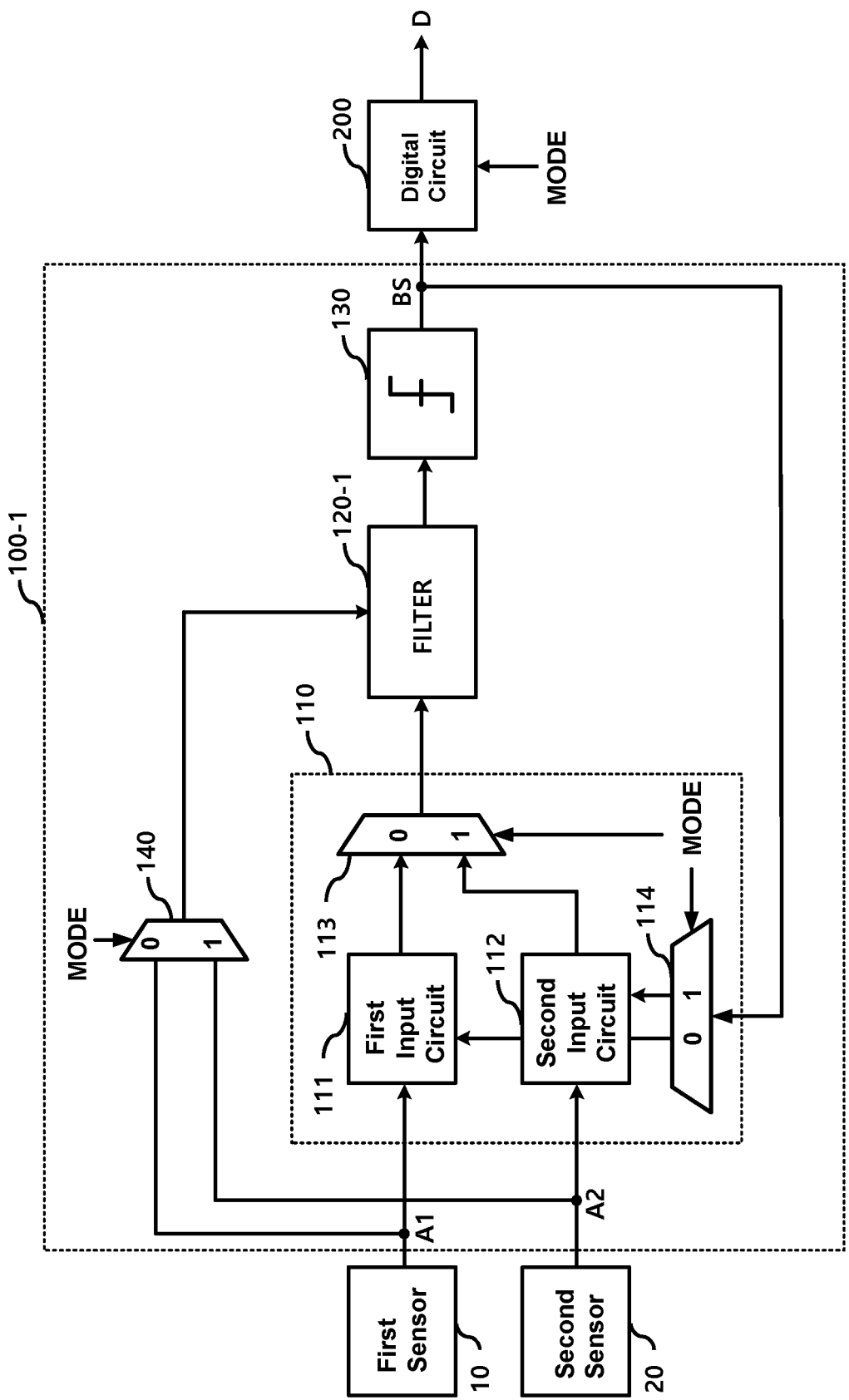

FIG. 2 is a block diagram illustrating an ADC according to an embodiment of the present invention.

The sigma delta modulator 100-1 in FIG. 2 is different from that of FIG. 1.

More specifically, the sigma delta modulator 100-1 in FIG. 2 further includes a third selector 140 for selecting the first analog signal A1 or the second analog signal A2 according to the mode signal MODE, and the filter 120-1 performs a noise shaping operation using an output signal of the input circuit 110 and an output signal of the third selector 140.

Operation[1] of the other components are substantially the same as the embodiment of FIG. 1.

Figure 3:
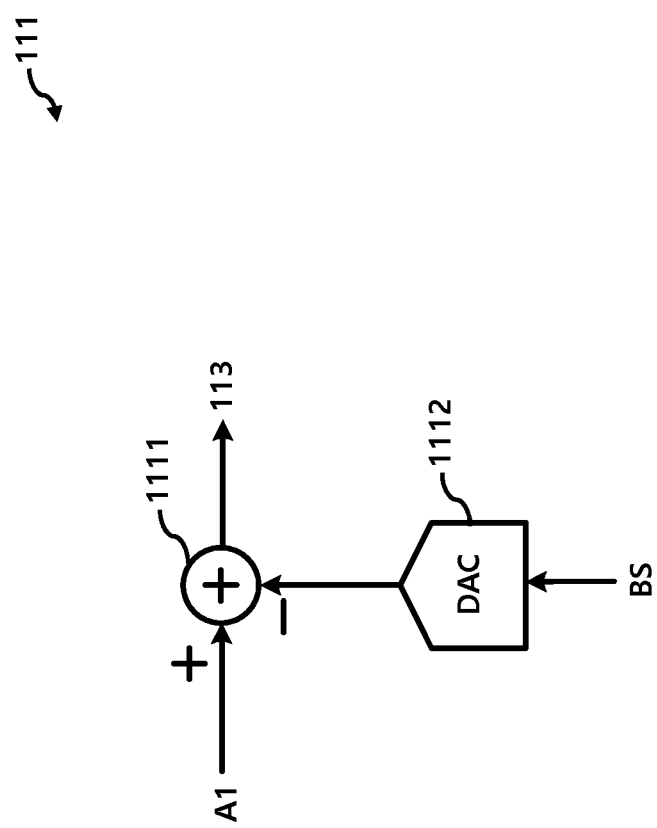
FIG. 3 shows a block diagram illustrating a first input circuit according to an embodiment of the present disclosure.

FIG. 3 is a block diagram illustrating the first input circuit 111 according to an embodiment of the present disclosure.

The first input circuit 111 includes a first operation circuit 1111 and a first digital-to-analog converter (DAC) 1112, wherein the first DAC 1112 converts the bit stream BS into an first feedback analog signal and the first operation circuit 1111 subtracts the first feedback analog signal from the first analog signals A1.

The output of the first operation circuit 1111 is provided as one of the inputs of the first selector 113.

Figure 4:
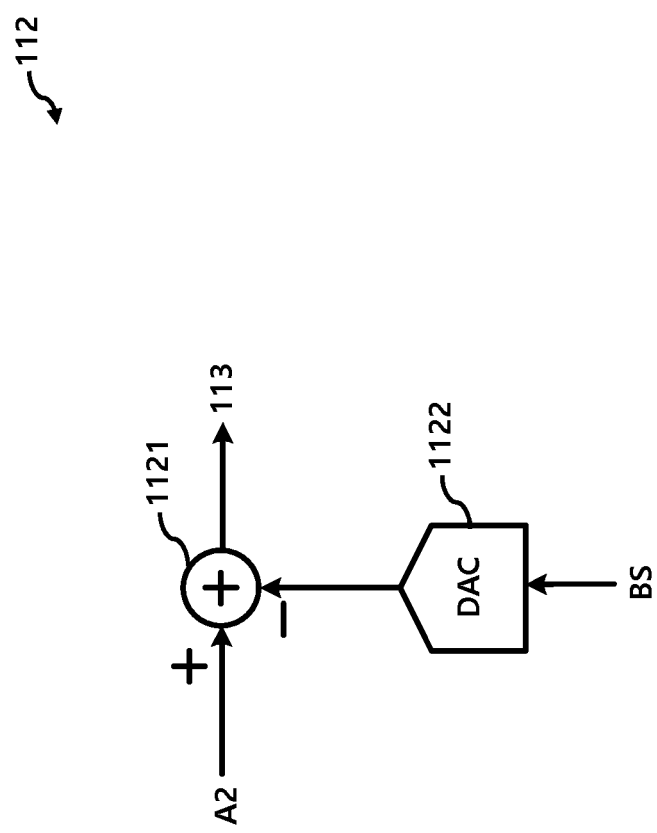
FIG. 4 shows a block diagram illustrating a second input circuit according to an embodiment of the present disclosure.

FIG. 4 is a block diagram illustrating the second input circuit 112 according to an embodiment of the present disclosure.

The second input circuit 112 includes a second operation circuit 1121 and a second DAC 1122, wherein the second DAC 1122 converts the bit stream BS into an second feedback analog signal and the second operation circuit 1121 subtracts the second feedback analog signal of the second DAC 1122 from the second analog signals A2.

The output of the second operation circuit 1121 is provided as one of the inputs of the first selector 113.

As shown in FIGS. 3 and 4, the first input circuit 111 and the second input circuit 112 may have substantially the same structure.

In this case, in order to reflect the operation characteristics of the first sensor 10 and the second sensor 20, specific design parameters of the first input circuit 111 and the second input circuit 112 may be set differently.

For example, specific design values of elements such as a capacitor and a resistor included in the first DAC 1112 and the second DAC 1122 may vary according to operating characteristics of the first sensor 10 and the second sensor 20.

The first operation circuit 1111 and the second operation circuit 1121 may also be designed independently according to a corresponding sensor.

According to the present disclosure, only the configuration of an input circuit receiving a signal output from a sensor may be independently changed, and the remaining circuits may be commonly used regardless of the operation mode.

Accordingly, the circuit area can be reduced compared to a case where a separate ADC is used for each sensor and an accurate analog-to-digital conversion operation can be performed according to the characteristics of the signal output from a sensor.

Figure 5:
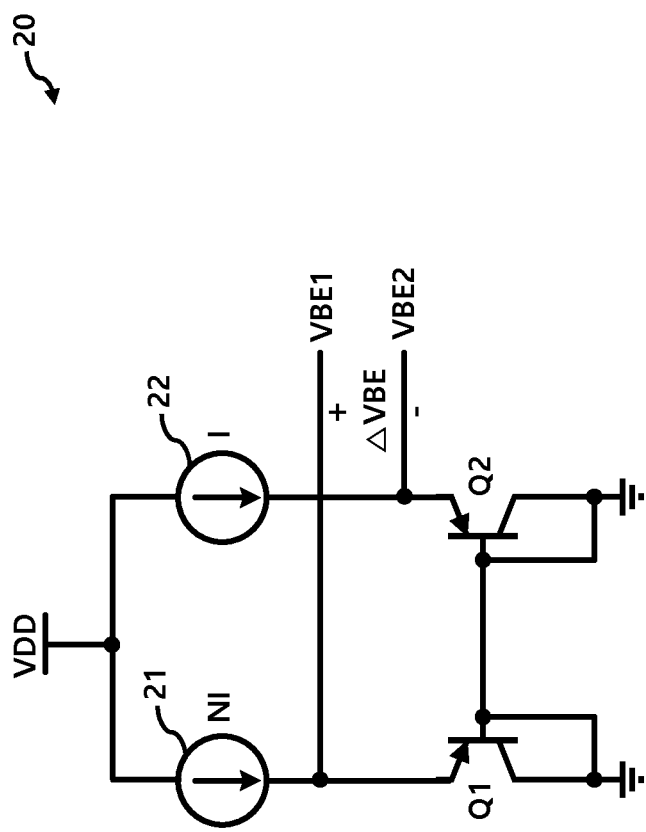
FIG. 5 shows a circuit diagram illustrating a second sensor according to an embodiment of the present disclosure.
Figure 6:
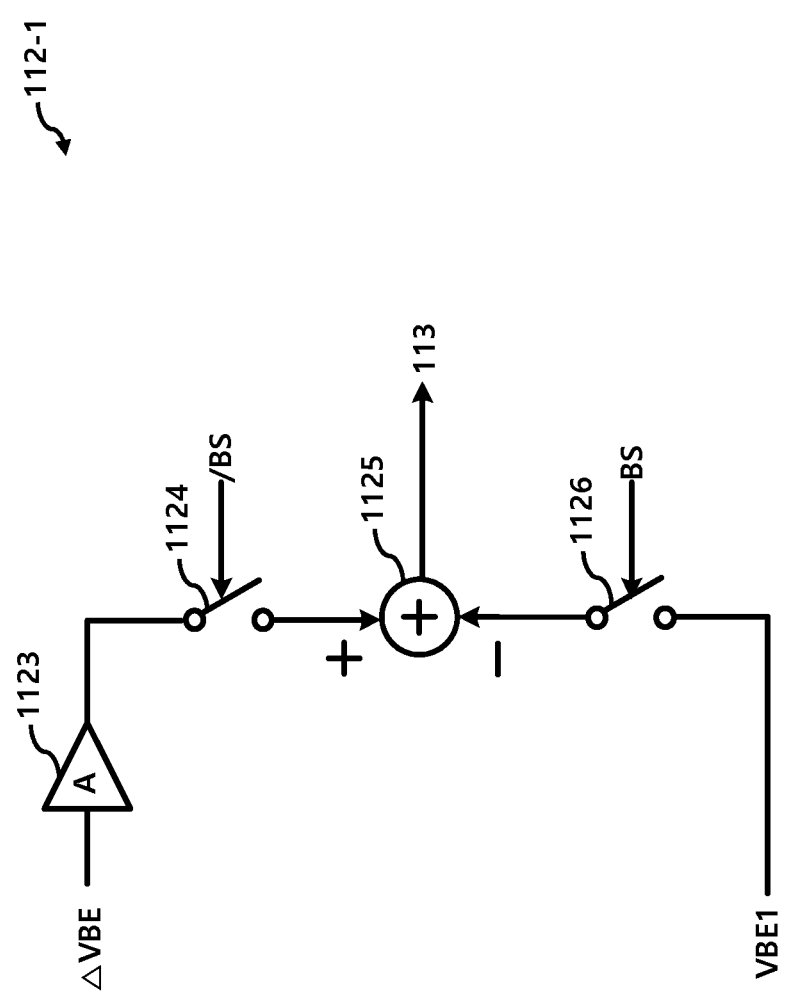
FIG. 6 shows a block diagram illustrating a second input circuit according to an embodiment of the present disclosure.

In FIG. 4, the second input circuit 112 has a configuration similar to that of the first input circuit 111, but in FIGS. 5 and 6, the second input circuit 112 has a different configuration from that of the first input circuit 111 according to the second sensor 20.

FIG. 5 shows a circuit diagram of a temperature sensor 20 according to an embodiment of the present disclosure.

The temperature sensor 20 includes a first current source 21 and a second current source 22 each connected to a power source VDD.

The first current source 21 may supply N times the current of the second current source 22, where N is a positive rational number.

The temperature sensor 20 includes a first bipolar transistor Q1 and a second bipolar transistor Q2. In this case, the sizes of the first and second bipolar transistors Q1 and Q2 are the same.

The bases and the sources of the first bipolar transistor Q1 and the second bipolar transistor Q2 are grounded, and the emitters thereof are connected to the first current source 21 and the second current source 22, respectively.

The first voltage VBE1 which is the base-emitter voltage of the first bipolar transistor Q1 and the second voltage VBE2 which is the base-emitter voltage of the second bipolar transistor Q2 are represented by Equations 1 and 2, respectively. In the following Equations 1 and 2, kT/q is the Boltzmann constant and Is is a proportional constant.

$$VBE1 = \frac{kT}{q}\ln\frac{NI}{Is} \qquad \text{[Equation 1]}$$

$$VBE2 = \frac{kT}{q}\ln\frac{I}{Is} \qquad \text{[Equation 2]}$$

In Equations 1 and 2, the voltage difference ΔVBE corresponding to the difference between the first voltage VBE1 and the second voltage VBE2 is represented by Equation 3 below.

$$\Delta VBE = \frac{kT}{q}\ln N \qquad \text{[Equation 3]}$$

As shown in Equation 3, the voltage difference ΔVBE increases linearly with absolute temperature T.

According to an embodiment, the temperature may be measured by receiving the voltage difference ΔVBE as the second analog signal A2 using the second input circuit 112 shown in FIG. 4.

However, errors may occur due to nonlinear characteristics inherent in the first and second bipolar transistors Q1 and Q2 or mismatches therebetween, and thus, there may be a limitation in accurate temperature measurement in the above-described manner.

In an embodiment using the temperature sensor 20 of FIG. 5, an error may be reduced by using the second input circuit 122-1 shown in FIG. 6.

FIG. 6 shows a block diagram of the second input circuit 112-1 according to an embodiment of the present disclosure.

The second input circuit 112-1 receives the first voltage VBE1 and the voltage difference ΔVBE from the temperature sensor 20 shown in FIG. 5.

The second input circuit 112-1 includes an amplifier 1123 that amplifies the voltage difference ΔVBE, a first switch 1124 that is turned on or off in response to a signal /BS which is an inversion of the bit stream BS, a second switch 1126 that is turned on or off in response to the bit stream BS, and a third operation circuit 1125.

The first switch 1124 provides an output signal from the amplifier 1123 to the third operation circuit 1125, and the second switch 1126 provides the first voltage VBE1 to the third operation circuit 1125.

Accordingly, the second input circuit 112-1 outputs amplified voltage difference ΔVBE when the bit stream BS is low, and outputs a value obtained by multiplying −1 by the first voltage VBE1 when the bit stream BS is high.

When the average of the bit stream BS output from the quantization circuit 130 converges to m, the output of the third operation circuit 1125 converges to zero. Accordingly, Equation 4 below holds. A represents the amplification ratio of the amplifier 1123.

$$A(1-m)\Delta VBE = mVBE1 \qquad (4)$$

By using Equations 3 and 4, relationship between the average value m and the voltage difference ΔVBE may be determined like the following Equation 5.

$$m = \frac{A\Delta VBE}{VBE1 + A\Delta VBE} \qquad \text{[Equation 5]}$$

In Equation 5, the amplification ratio A may be determined through a circuit design, and the first voltage VBE1 may be determined according to the current value of the second current source 22.

The digital circuit 200 may know the voltage difference ΔVBE by measuring the average value m of the bit stream BS and may determine the temperature value T.

In an embodiment using the second input circuit 112-1 shown in FIG. 6, compared to an embodiment using the second input circuit 112 of FIG. 4, relatively higher precision measurement is possible and an error may be reduced.

In FIGS. 1 and 2, the filters 120 and 120-1 may be implemented using an integrator.

The filters 120 and 120-1 differs from each other in that the filter 120 of FIG. 1 performs filtering using only an output signal from the input circuit 110, but the filter 120-1 of FIG. 2 performs filtering operation using both an output signal from the input circuit 110 and input signals of the input circuit 110.

Figure 7:
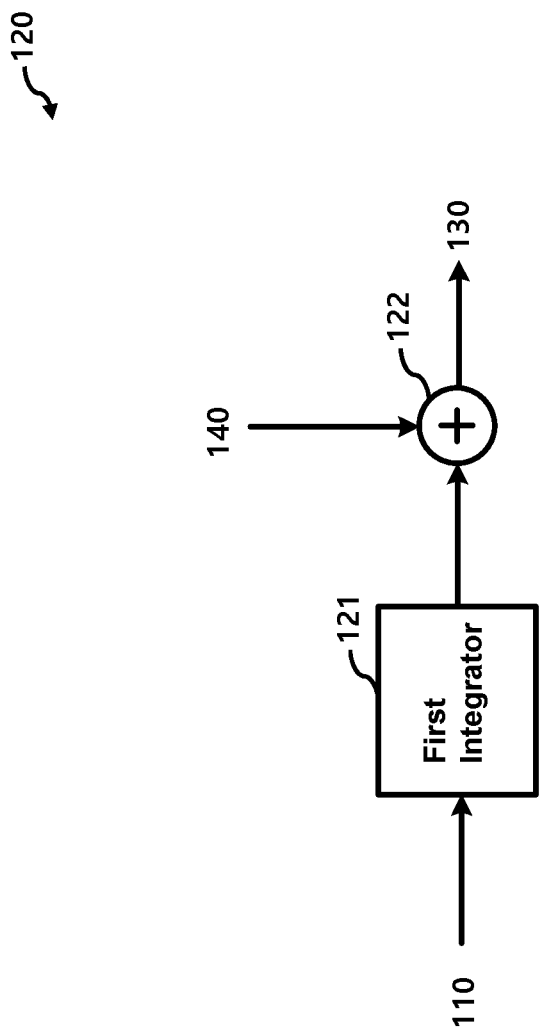
FIGS. 7 and 8 show block diagrams each illustrating a filter according to an embodiment of the present disclosure.

FIG. 7 shows a block diagram illustrating the filter 120 according to an embodiment of the present disclosure.

In FIG. 7, the filter 120 includes a first integrator 121 that integrates an output signal of the input circuit 110, and a fourth operation circuit 122 that performs an operation on an output signal of the first integrator 121 and an output signal of the third selector 140 and provides an operation result thereof to the quantization circuit 130.

In this case, since the third selector 140 selects and outputs the first analog signal A1 or the second analog signal A2 according to the operation mode, an output signal of the third selector 140 may correspond to an input signal of the input circuit 110.

Figure 8:
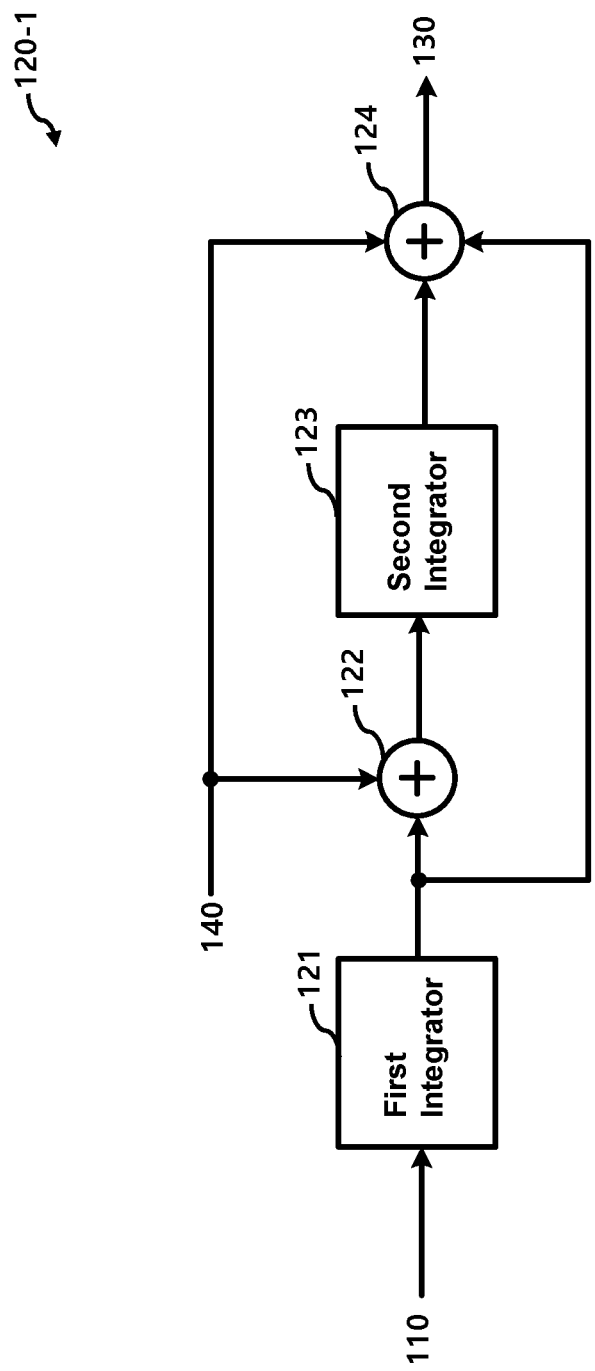

FIG. 8 shows a block diagram illustrating the filter 120-1 according to an embodiment of the present disclosure.

In FIG. 8, the filter 120-1 includes a first integrator 121 that integrates an output signal of the input circuit 110, a fourth operation circuit 122 that performs an operation on an output signal of the first integrator 121 and an output signal of the third selector 140, a second integrator 123 that integrates an output signal of the fourth operation circuit 122, a fifth operation circuit 124 that performs an operation on an output signal of the first integrator 121, an output signal of the third selector 140, and an output signal of the second integrator 123 and provides an operation result thereof to the quantization circuit 130.

The filters 120 and 120-1 may be implemented in various ways.

In embodiments shown in FIGS. 1 and 2, the ADC receives a signal from two sensors.

However, the scope of the present invention is not limited thereto, and an ADC capable of receiving a signal from three or more sensors and performing an operation mode corresponding to each sensor is also within the scope of the present invention.

Specific embodiments thereof may be readily derived with reference to the above disclosure. For example, the number of sub input circuits included in the input circuit 110 may be extended to correspond to the number of sensors, the number of bits of the mode signal MODE may be increased, or the number of signals selected by the first to third selectors may be increased.

Figure 9:
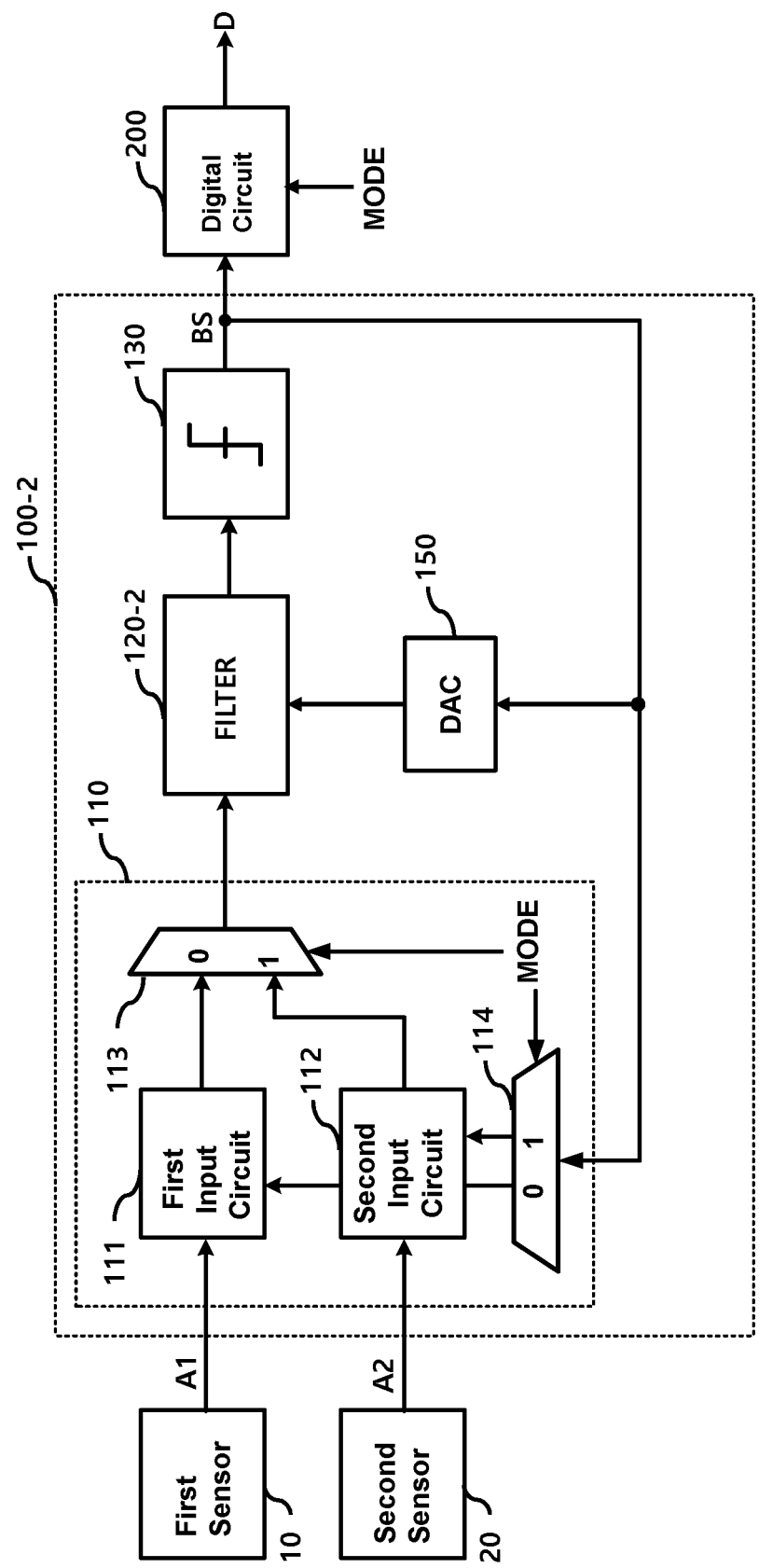
FIGS. 9 to 11 show block diagrams each illustrating an ADC according to an embodiment of the present disclosure.

FIG. 9 is a block diagram illustrating an ADC according to an embodiment of the present disclosure.

Compared with an embodiment in FIG. 2, the sigma delta modulator 100-2 in FIG. 9 further includes a third DAC 150.

The third DAC 150 converts the bit stream BS into an analog signal and provides it to the filter 120-2.

The filter 120-2 in FIG. 9 may be implemented as an analog filter having higher order than the filter 120 of FIG. 1.

Those skilled in the art will be able to easily design and modify the sigma delta modulator by combining FIGS. 2 and 9.

Figure 10:
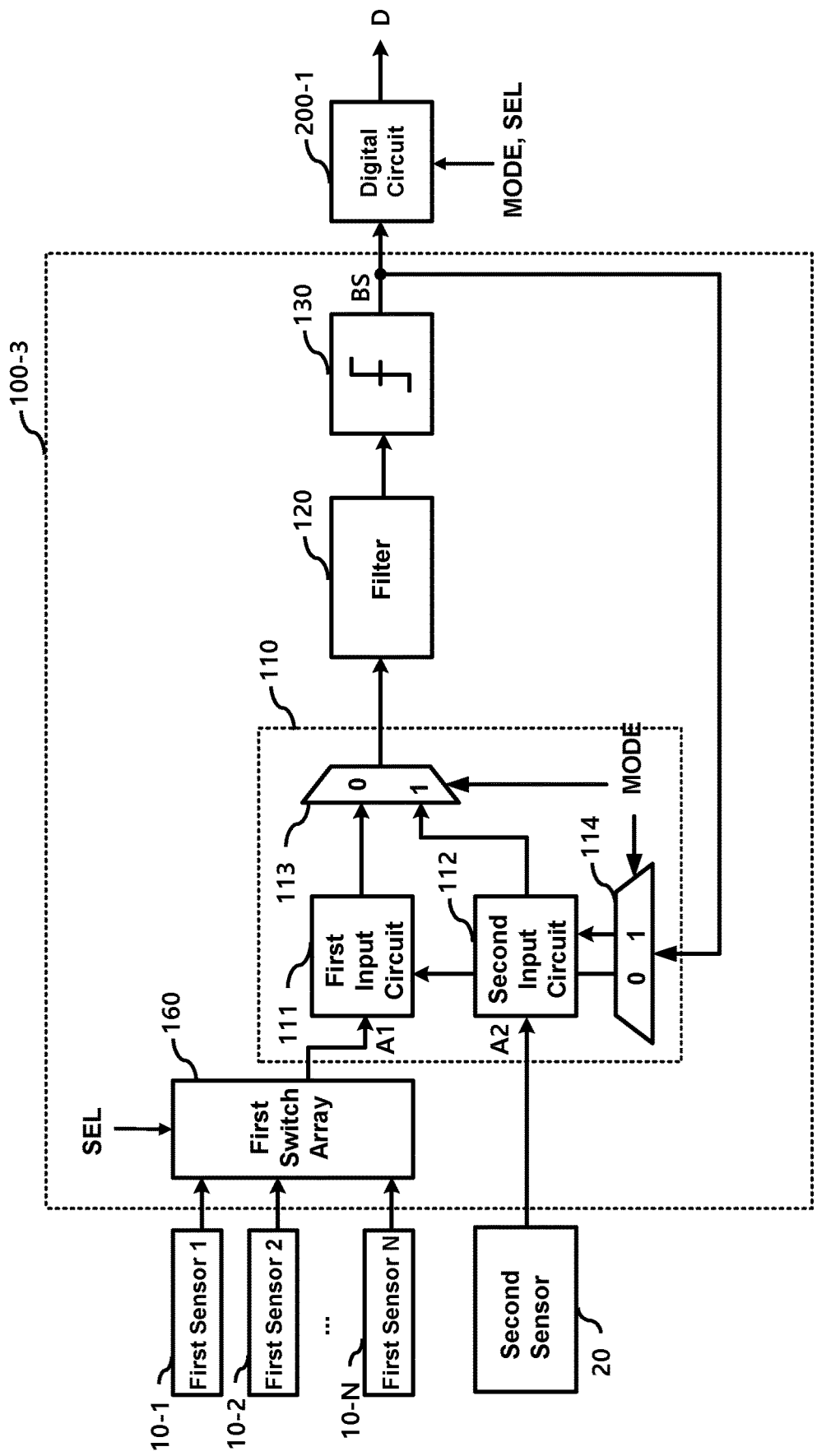

FIG. 10 shows a block diagram illustrating an ADC according to an embodiment of the present disclosure.

In the embodiment of FIG. 10, signals are received from a plurality of first sensors 10-1, 10-2, ..., 10-N, where N is an integer larger than 2. Each of the plurality of first sensors 10-1, 10-2, ..., 10-N may be referred as a sub sensor.

In the embodiment of FIG. 10, the sigma delta modulator 100-3 further includes a first switch array 160 compared with the sigma delta modulator 100 shown in FIG. 1.

The first switch array 160 selects any one of the plurality of first sensors 10-1, 10-2, ..., 10-N as the first analog signal A1 according to the selection signal SEL, and outputs the first analog signal A1 to the first input circuit 111.

The embodiment of FIG. 10 may be desirable when the plurality of first sensors have similar characteristics since output signals thereof may be provided to the same first input circuit 111.

In the embodiment of FIG. 10, the digital circuit 200-1 may further receive the selection signal SEL together with the mode signal MODE.

The digital circuit 200-1 may perform different operations according to the selected one of the plurality of first sensors with reference to the selection signal SEL together with the mode signal MODE.

The operation of the other components is substantially the same as described above, so a detailed description thereof will not be repeated.

Figure 11:
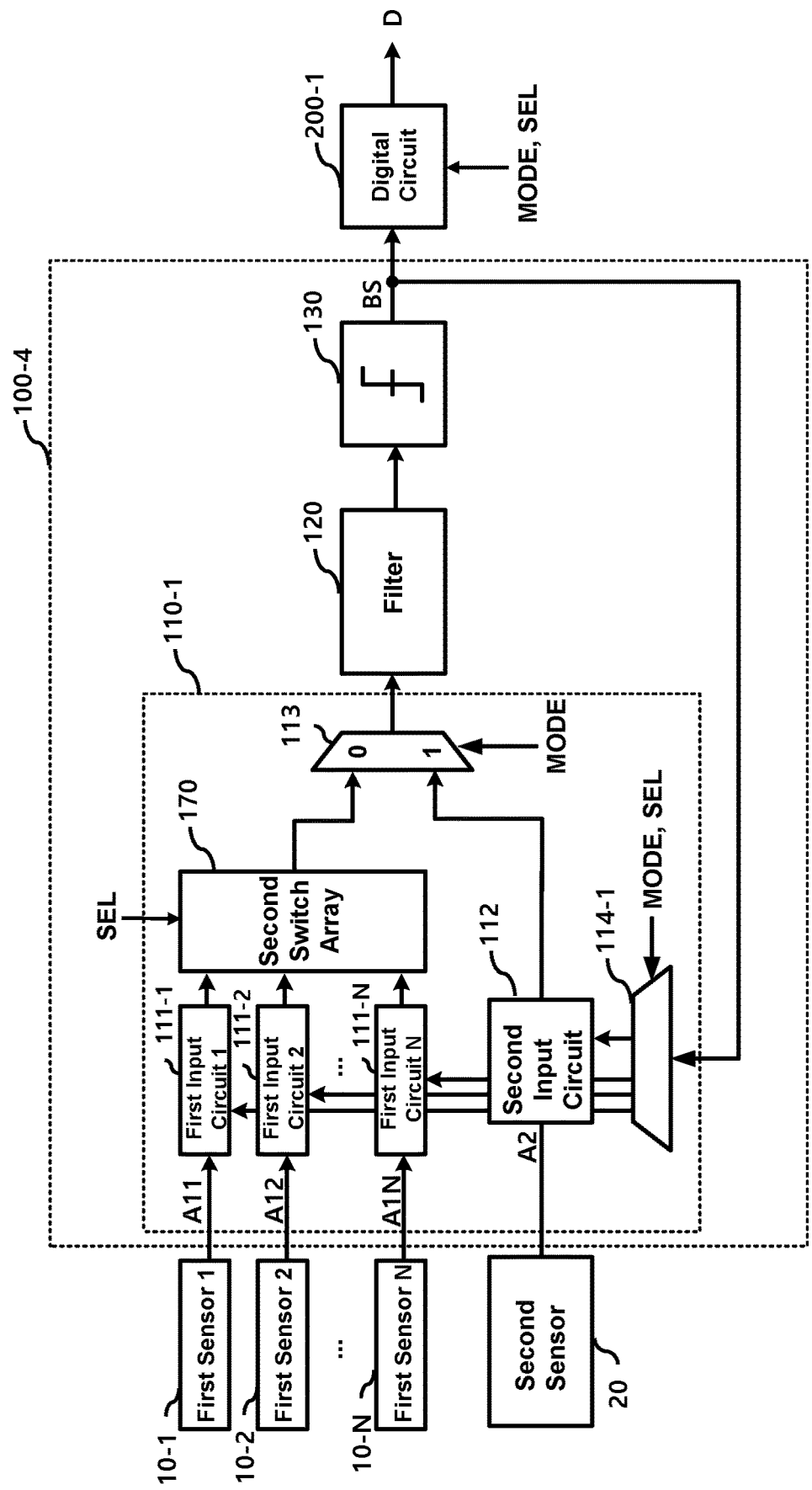

FIG. 11 is a block diagram illustrating an ADC according to an embodiment of the present disclosure.

In the embodiment of FIG. 11, signals are received from a plurality of first sensors 10-1, 10-2, ..., 10-N, wherein N is an integer larger than 2.

The embodiment of FIG. 11 includes a plurality of first input circuits 111-1, 111-2, ..., 111-N each receiving a signal from a corresponding one of the plurality of sensor signals A11, A12, ..., A1N output from the plurality of first sensors 10-1, 10-2, ..., 10-N.

Each of the plurality of first input circuits 111-1, 111-2, ..., 111-N may have a structure substantially the same as that shown in FIG. 3. Each of the plurality of first input circuits 111-1, 111-2, ..., 111-N may be referred as a sub input circuit.

In the embodiment of FIG. 11, the sigma delta modulator 100-4 further includes a second switch array 170.

The second switch array 170 selects any one of the plurality of first input circuits 111-1, 111-2, ..., 111-N according to the selection signal SEL, and outputs a signal to the first selector 113.

Since the plurality of first input circuits 111-1, 111-2, ..., 111-N can be designed independently, the embodiment of FIG. 11 may be desirable when the plurality of first sensors 10-1, 10-2, ..., 10-N have different characteristics.

The second selector 114-1 refers to the selection signal SEL together with the mode signal MODE to provide the bit stream BS to one of the plurality of first input circuits 111-1, ..., 111-N and the second input circuit 112.

The digital circuit 200-1 may perform different operations according to the selected one of the plurality of first sensors with reference to the selection signal SEL together with the mode signal MODE.

The operation of the other elements are substantially the same as described above, so a detailed description thereof will not be repeated.

Those skilled in the art will be able to design and modify various structures of the sigma delta modulator that receives signals from multiple sensors by combining the embodiments of FIGS. 10 and 11.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An analog-to-digital converter (ADC) comprising:
    an input circuit configured to receive a first analog signal output from a first sensor or a second analog signal output from a second sensor according to an operation mode and a bit stream;
    a filter configured to filter an output signal from the input circuit;
    a quantization circuit configured to generate the bit stream from an output signal of the filter; and
    a digital circuit configured to generate a first digital signal corresponding to the first analog signal or a second digital signal corresponding to the second analog signal by filtering the bit stream,
    wherein the operation mode includes a first mode selecting the first sensor and a second mode selecting the second sensor,
    wherein the digital circuit refers to the second digital signal generated during the second mode to generate the first digital signal during the first mode,
    wherein the first input circuit comprises:
        a first input circuit configured to generate an output signal according to the first analog signal and the bit stream in the first mode;
        a second input circuit configured to generate an output signal according to the second analog signal and the bit stream in the second mode;

a first digital-to-analog converter (DAC) configured to convert the bit stream into a first feedback analog signal; and
a first operation circuit configured to perform an operation on the first analog signal and the first feedback analog signal.

2. The ADC of claim 1, further comprising:
a first selector configured to select an output signal from the first input circuit or an output signal from the second input circuit according to the operation mode; and
a second selector configured to provide the bit stream to the first input circuit or the second input circuit according to the operation mode.

3. The ADC of claim 2, further comprising a second switch array configured to select one of a plurality of input signals according to a selection signal,
wherein the first sensor includes a plurality of sub sensors providing the plurality of input signals,
wherein the first input circuit includes a plurality of sub input circuits each receiving a corresponding one of the plurality of input signals;
wherein output signals from the plurality of sub input circuits are input to the second switch array and an output signal from the second switch array is provided to the first selector.

4. The ADC of claim 1, wherein the second input circuit comprises:
a first digital-to-analog converter (DAC) configured to convert the bit stream into a second feedback analog signal; and
a first operation circuit configured to perform an operation on the second analog signal and the second feedback analog signal.

5. The ADC of claim 1, wherein the second analog signal corresponds to a temperature.

6. The ADC of claim 5, wherein the second analog signal includes a voltage difference between a first voltage and a second voltage, and
wherein the second input circuit includes:
an amplifier configured to amplify the voltage difference;
a first switch configured to output a signal from the amplifier according to an inversion of the bit stream;
a second switch configured to output the first voltage according to the bit stream; and
a third operation circuit configured to perform an operation on an output of the first switch and an output of the second switch.

7. The ADC of claim 1, wherein the digital circuit comprises a register configured to store the second digital signal.

8. The ADC of claim 1, further comprising a first switch array configured to select one of a plurality of input signals according to a selection signal,
wherein the first sensor includes a plurality of sub sensors providing the plurality of input signals, and
wherein an output signal from the first switch array is provided to the first input circuit as the first analog signal.

9. The ADC of claim 1, wherein the filter comprises an integrator.

10. An analog-to-digital converter (ADC) comprising:
an input circuit configured to receive a first analog signal output from a first sensor or a second analog signal output from a second sensor according to an operation mode and a bit stream;
a filter configured to filter an output signal from the input circuit;
a quantization circuit configured to generate the bit stream from an output signal of the filter; and
a digital circuit configured to generate a first digital signal corresponding to the first analog signal or a second digital signal corresponding to the second analog signal by filtering the bit stream,
wherein the operation mode includes a first mode selecting the first sensor and a second mode selecting the second sensor, and
wherein the digital circuit refers to the second digital signal generated during the second mode to generate the first digital signal during the first mode,
wherein the filter further receives an output signal of the first sensor or an output signal of the second sensor according to the operation mode, and
wherein the ADC further comprises a third selector configured to select an output signal of the first sensor or an output signal of the second sensor according to the operation mode to provide an output signal thereof to the filter.

11. The ADC of claim 10, wherein the filter comprises:
a first integrator configured to integrate an output signal of the input circuit; and
a fourth operation circuit configured to perform an operation on an output of the first integrator and a first analog signal or a second analog signal according to the operation mode.

12. The ADC of claim 11, wherein the filter further comprises:
a second integrator configured to integrate an output signal of the fourth operation circuit; and
a fifth operation circuit configured to perform an operation on an output of the first integrator, an output of the second integrator, and a first analog signal or a second analog signal according to the operation mode.

13. An analog-to-digital converter (ADC) comprising:
an input circuit configured to receive a first analog signal output from a first sensor or a second analog signal output from a second sensor according to an operation mode and a bit stream;
a filter configured to filter an output signal from the input circuit;
a quantization circuit configured to generate the bit stream from an output signal of the filter; and
a digital circuit configured to generate a first digital signal corresponding to the first analog signal or a second digital signal corresponding to the second analog signal by filtering the bit stream,
wherein the operation mode includes a first mode selecting the first sensor and a second mode selecting the second sensor, and
wherein the digital circuit refers to the second digital signal generated during the second mode to generate the first digital signal during the first mode,
wherein the ADC further comprises a third DAC configured to convert the bit stream into an analog signal to provide to the filter,
wherein the filter configured to perform filtering operation using an output signal of the input circuit and an output signal of the third DAC.

* * * * *